United States Patent [19]

MacIver

[11] 4,096,622
[45] Jun. 27, 1978

[54] ION IMPLANTED SCHOTTKY BARRIER DIODE

[75] Inventor: Bernard A. MacIver, Lathrup Village, Mich.

[73] Assignee: General Motors Corporation, Detroit, Mich.

[21] Appl. No.: 759,324

[22] Filed: Jan. 14, 1977

Related U.S. Application Data

[62] Division of Ser. No. 600,888, Jul. 31, 1975, abandoned.

[51] Int. Cl.² ............................................. B01J 7/00
[52] U.S. Cl. .................................... 29/578; 29/576 B; 148/1.5
[58] Field of Search ............... 29/576 B, 578; 148/1.5; 357/15; 427/84

[56] References Cited

U.S. PATENT DOCUMENTS 3,747,203  7/1973  Shannon .............................. 29/578

Primary Examiner—Gerald A. Dost
Attorney, Agent, or Firm—Robert J. Wallace

[57] ABSTRACT

A Schottky barrier diode having a subsurface metal-semiconductor rectifying barrier with electrical rectification properties immune to semiconductor surface contamination. A special ion implantation technique is used to produce a very thin but strongly metallic island-like region in a semiconductive body. A Schottky barrier separates the region from the semiconductive body below the semiconductor body surface. A special truncated Gaussian profile in metal concentration through the thickness of the region provides low thermal and electrical resistance between the Schottky barrier and the region surface.

3 Claims, 10 Drawing Figures

ION IMPLANTED SCHOTTKY BARRIER DIODE

RELATED PATENT APPLICATION

This is a division of U.S. patent application Ser. No. 600,888, filed July 31, 1975, now abandoned.

BACKGROUND OF THE INVENTION

This invention relates to a Schottky diode and to a method of making such a diode. More particularly this invention relates to a Schottky diode having a subsurface rectification barrier immune to semiconductor surface contamination, and to a special ion implantation technique for making such a barrier.

Schottky diodes are devices having a metal-semiconductor interface that exhibits electrical rectification properties. Such devices are more attractive than PN junction diodes in certain applications. In Schottky diodes, charge is transported predominantly by majority carriers. There is virtually no minority carrier storage to maintain the flow of current as occurs in PN junctions when they are switched from the forward to the reverse biased conditions. Accordingly, Schottky barrier diodes can operate at much higher frequencies than PN junction diodes. In addition, the Schottky diode forward voltage is lower than that of a PN junction for a given current. For these reasons the Schottky diode more nearly approximates an ideal switch. Another important advantage is realized in power rectifier applications. Heat is readily removed through the high thermal conductivity metallic layer of a Schottky diode, instead of through a semiconductor layer of a PN junction rectifier.

Schottky diodes are commercially available for a wide range of applications. However, elaborate precautions must be taken in manufacturing them, to exclude foreign matter from the metal-semiconductor interface. Such foreign matter can deleteriously affect device reproducibility in manufacture, and stability in use. Accordingly, it is customary to take exceptional steps to insure semiconductor surface cleanliness before applying the metal electrode. For silicon, a typical final surface preparation immediately prior to deposition of the metal electrode includes a special hydrofluoric acid-based etch and/or a back sputtering step, to remove any residual natural oxide and/or organic surface contaminants. Also, the silicon surface is maintained in a clean non-oxidizing atmosphere. However, even then there is still a high probability that natural oxide, chemicals, or adsorbed gases will be included at the metal-silicon interface. It is most desirable, for example, to chemically clean the surface of a silicon body, and then place the silicon body in a vacuum chamber, where the chemically cleaned surface is back sputtered to remove any residual contaminants. While still maintaining a low pressure in the vacuum chamber, a platinum electrode is evaporated onto the silicon surface. Then the silicon body is removed from the vacuum chamber.

U.S. Pat. No. 3,858,304 Leedy et al. discloses successively evaporating several metal layers to form a Schottky metal electrode in a single evacuation. However, such a contact is subject to deleterious affects of any residual contamination on the semiconductor surface. Another technique for forming a Schottky barrier is disclosed in U.S. Pat. No. 3,558,366 Lepselter. In this latter technique a deposited platinum layer is alloyed with silicon to form a subsurface barrier of platinum silicide. The alloying technique does not make the platinum-silicon interface immune from contamination on the silicon surface. In the *Bell System Technical Journal,* v 47, p. 198 (February 1968) Lepselter et al. point out that the alloying reaction is strongly influenced by surface cleanliness. Accordingly, surface cleanliness on the semiconductor body is an extremely important factor influencing performance of the Schottky barrier, whether the Schottky barrier metal is alloyed to the semiconductor or not.

This invention presents a Schottky barrier diode having rectification properties independent of residual surface contamination on the semiconductor body. It also presents a method of forming such a Schottky barrier diode.

OBJECTS AND SUMMARY OF THE INVENTION

It is, therefore, an object of this invention to provide a Schottky barrier diode having a subsurface metal-semiconductor interface which exhibits rectification properties independent of residual contamination on the semiconductor surface.

Another object of the invention is to provide a special ion implantation technique for making Schottky barrier diodes having a metal-semiconductor interface independent of residual contamination on the semiconductor surface.

In this invention an extremely shallow, and distinctively concentrated region of ion implanted electronically neutral metal atoms forms an integral subsurface metal-semiconductor rectifying barrier. The region has a depth of less than about 500 angstroms. It also has a special metal atom concentration profile through its thickness produced by a special ion implantation technique. In this technique a selected region on the semiconductor surface is covered with a layer that a preselected ion beam can penetrate but which has a thickness commensurate with the thickness of an ion implanted region to be formed beneath it. Other surface portions are covered with a layer the ion beam cannot penetrate. The semiconductor surface is then exposed to a beam of high velocity ions of the electronically neutral metal. The ions have an average energy preselected to cause only about 50 to 60% of the ions to penetrate the covering layer. The ions penetrating the covering layer lodge within about 500 angstroms of the semiconductor surface. An ion beam dose of at least about $1 \times 10^{15}$ atoms per square centimeter is given to produce a narrow truncated substantially Gaussian concentration profile through the thickness of the region. Especially satisfactory results are obtained if this region intersects a guard ring at the semiconductor surface.

BRIEF DESCRIPTION OF THE DRAWING

Other objects, features and advantages of this invention will become more apparent from the following description of preferred embodiments thereof and from the drawing in which.

DESCRIPTION OF THE PREFERRED EMBODIMENTS

Figure 1:
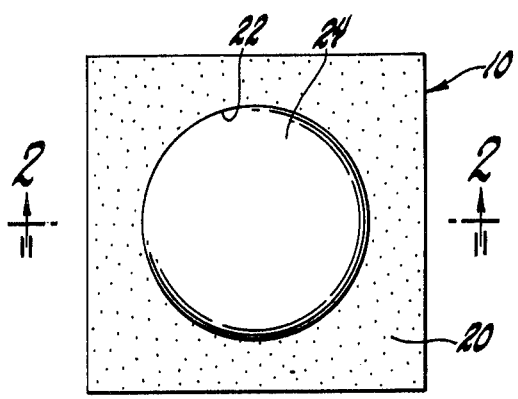
FIG. 1 is a plan view showing a Schottky barrier diode made in accordance with this invention.
Figure 2:
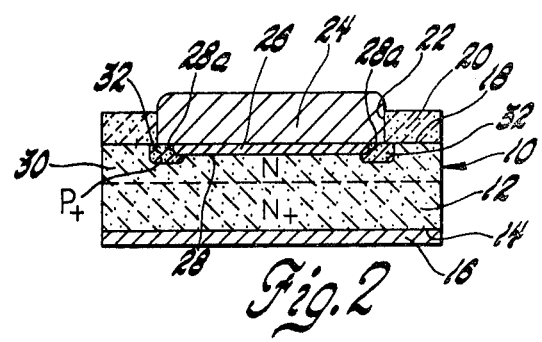
FIG. 2 is a cross-sectional view along the lines 2—2 of FIG. 1.

FIGS. 1 and 2 show a 0.5 ohm-centimeter N-type monocrystalline silicon chip 10 that is 40 mils square and 10 mils thick. Chip 10 has an N+ layer about 9.5 mils thick on its lower surface 14, to reduce contact resistance with an electrolessly deposited nickel electrode 16 that covers the entire lower surface 14. Nickel electrode 16 is about 2 mils thick. Upper surface 18 of chip 10 has a 5,000 to 6,000 angstrom thick silicon dioxide layer 20 on it that has a circular window 22, within which a portion of surface 18 is exposed. Window 22 has a diameter of about 25 mils. A circular aluminum electrode 24 about 5,000 angstroms thick is disposed within and completely fills window 22 on surface 18.

A shallow and functionally metallic circular island-like region 26 is implanted in surface 18. It is concentric with and has a smaller diameter than electrode 24, and is in good electrical and thermal contact with electrode 24. A narrow truncated substantially Gaussian profile of highly concentrated electronically neutral metal atoms through the thickness of region 26 makes region 26 functionally metallic. The concentration profile is maximum at chip surface 18 and minimum at interface 28 with the body portion 30. Nonetheless, the unique high density profile of implanted neutral metal atoms still permits a metalsemiconductor rectifying barrier at interface 28. In this unique concentration profile, there is at least about $1 \times 10^{22}$ metal atoms per cubic centimeter of the region at surface 18. The concentration of electronically neutral metal atoms in region 26 is substantially uniform parallel to surface 18.

Metallic region 26 has a preferred depth of about 250 - 300 angstroms. However, its depth can be varied from about 100 - 500 angstroms. I believe that this confines the aforesaid high density truncated substantially Gaussian concentration profile to an extremely narrow band, resulting in very useful rectification characteristics at the metal-silicon interface 28.

Any electronically neutral metal atom can be used to form a Schottky barrier 28 with silicon region 30. By electronically neutral metal, I mean any metal which is not a conductivity-determining impurity in the particular semiconductor involved, as for example a metal which will not dope a given semiconductor to either P-type or N-type conductivity and which will not form a PN junction with that semiconductor. Any metal which will form a satisfactory Schottky barrier in the prior art devices such as heretofore mentioned can be used in practicing this invention. The criterion for selecting the particular electronically neutral metal desired in a given application is essentially the same as in this invention as for prior art devices. As for example, in most instances one would prefer a metalsemiconductor work function difference of at least about 0.5 volts. Accordingly, for silicon I prefer that the electronically neutral metal be platinum, palladium or gold. On the other hand, molybdenum, nickel and chromium can also be used, as well as a variety of other metals. Analogously the semiconductor can be germanium, or a compound semiconductor, depending on the characteristics desired.

Circular region 26 partially extends into the circumscribing annular guard ring 32, which is also embedded in surface 18. Guard ring 32 is an annular region of P-type silicon that is approximately 1,000 angstroms thick. It contacts circumferential portions of circular aluminum electrode 24, and is in low resistance electrical communication with electrode 24. Annular region 32 is concentric with circular electrode 24. It has an inner diameter of about 0.036 cm and an outer diameter of about 0.066 cm, which forms an annulus about 0.003 cm wide. Circular metal electrode 24 overlaps the annulus by about 0.002 cm. Guard ring 32 controls leakage in this device, as it would in any prior art device. In addition, it can be seen that surface intersecting portions 28a of metal-semiconductor interface 28 do not function as a Schottky barrier. Accordingly, the entire rectifying portion of interface 28 is below the surface 18 and is thus immune to deleterious affects of contaminants on surface 18.

The device illustrated in FIGS. 1 and 2 is made by a specifically modified ion implantation technique. This technique is now described in connection with FIGS. 3a through FIGS. 3h. My device is normally made simultaneously with a plurality of other identical such devices in a large monocrystalline silicon wafer, as is customary. However, for clarity of illustration, the manufacture of only one such device is illustrated in the drawing. A 0.5 ohm-centimeter N-type silicon wafer is initially prepared by forming the N+ layer 12 on its lower surface by diffusion. Any N-type conductivity determining impurity can be used to produce the N+ layer 12, as for example phosphorus, antimony or arsenic. The upper surface 18 of chip 10 is then cleaned in the usual manner for producing other types of semiconductor devices, as for example hydrofluoric acid etch followed by etching in an aqueous solution containing 10% hydrogen peroxide. Only the normal precautions on cleanliness associated with making PN junction type semiconductor devices need be observed. The exceptionally stringent cleaning procedures normally incident to making Schottky barrier devices need not be used.

A 5,000 angstrom thick layer 20 of silicon dioxide is then thermally grown on surface 18 in wet oxygen containing 0.3% by volume hydrogen chloride. Silicon dioxide layer 20 has sufficient thickness to serve as a masking layer for producing a guard ring 32 in body portion 30 of the wafer.

An annular window 33 is then photoetched in the usual manner through layer 20 to expose an annular region on surface 18. Annular window 33 has dimensions parallel to surface 18 essentially the same as dimensions for guard ring region 32.

Figure 3A:
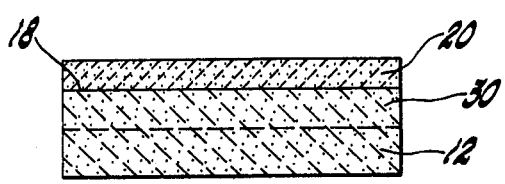
FIGS. 3a through 3h are cross-sectional views illustrating the various steps in making the device illustrated in FIGS. 1 and 2.
Figure 3B:
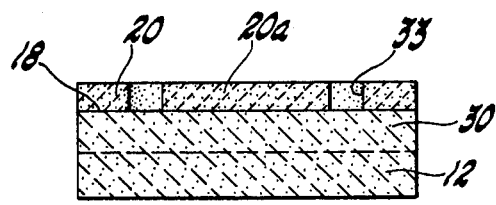
Figure 3C:
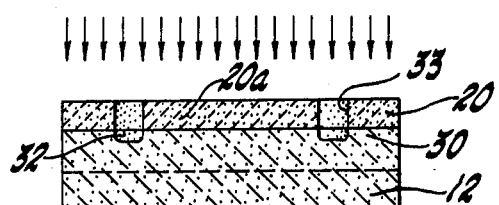
Figure 3D:
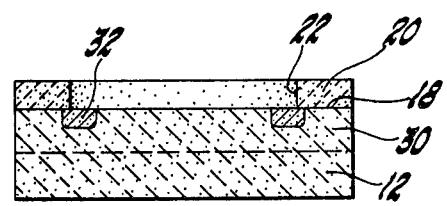
Figure 3E:
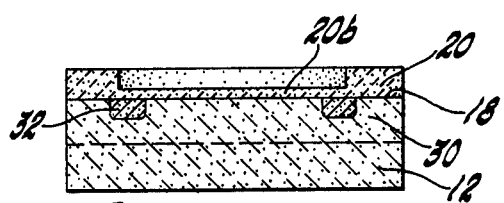

As shown in FIG. 3c the upper surface of the wafer is then uniformly exposed to a beam of high velocity boron ions which have an energy of 100 keV. A dose of about $1 \times 10^{15}$ to $5 \times 10^{15}$ boron atoms per square centimeter is given to predeposit boron on surface 18 for subsequent diffusion. After the boron implantation, the wafer is heated at 1100° C. in nitrogen for 1 hour to activate and redistribute the implanted boron atoms. This forms guard ring region 32, as shown in FIG. 3d. If desired, guard ring 32 can also be formed by predepositing the boron in other ways and then driving it into the silicon.

The circular portion 20a of silicon dioxide layer 20 within window 33 is then photoetched completely away. This transforms annular window 33 into a circular window 22, the window in FIG. 2 for electrode 24. A 300 angstrom thick layer 20b of silicon dioxide is then preferably thermally grown in dry oxygen over the entire exposed portion of surface 18 within window 22. Layer 20b can be penetrated by an ion beam and is generally equal to the thickness of ion implanted region 26 which is to be subsequently formed. While not preferred, layer 20b need not be formed in the manner stated, and can be of a substance other than silicon dioxide. However, layer 20b must be penetrable by the ion beam used to form region 26 and must have a thickness commensurate with the thickness of region 26. By having a commensurate thickness I mean that layer 20b has a thickness such as to allow only about 50 – 60% of the ions in the impinging beam to penetrate it and lodge within about 500 angstroms of surface 18 above wafer body portion 30. I prefer that layer 20b have an ion stopping power substantially equal to that of silicon. This simplifies obtaining predetermined thicknesses in the region 26. Substances having a significantly higher ion stopping power than silicon are to be avoided. Substances having a lower ion stopping power than silicon will have to be used with correspondingly increased thicknesses.

Figure 3F:
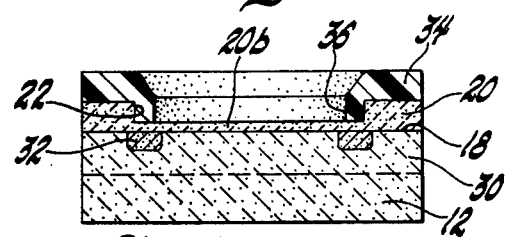
Figure 3G:
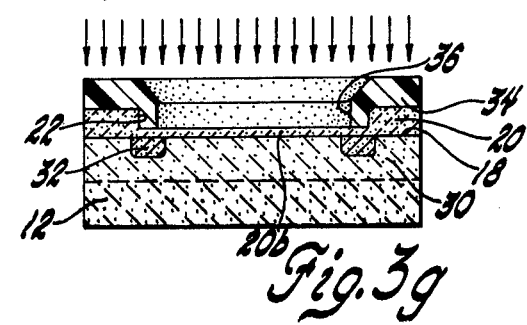
Figure 3H:
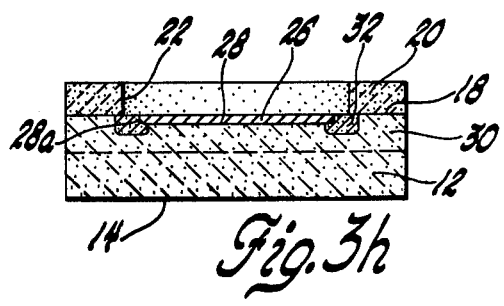

A layer of photoresist 34 is then applied over the entire surface of silicon dioxide layer 20, including the thinner portion 20b. A circular window 36 concentric with annular region 32 is then opened in the photoresist layer 34. The usual photoresist developing techniques can be used in opening window 36. The precise diameter of window 36 is not critical so long as it is slightly larger than the inner diameter of region 32, and substantially less than the outer diameter of region 32. Window 36 in photoresist layer 34 is shown in FIG. 3f.

The entire upper surface of the wafer having the photoresist mask is then uniformly exposed to a beam of 100 keV platinum ions. The exposure is continued for a sufficient duration to give the upper surface of the wafer a platinum ion dose at least about $1 \times 10^{15}$ platinum atoms per square centimeter. This provides a platinum concentration of at least $1 \times 10^{22}$ atoms per cubic centimeter at the projected range. Chloroplatinic acid ($H_2PtCl_6$) is used as the source of platinum ions in the plasma accelerated in the ion implanting apparatus. Implantation should be done at a non-channeling angle to insure obtaining the narrow truncated Gaussian concentration profile that produces the Schottky barrier. For example, the high index crystallo-graphic direction of the wafer, the <110> plane in monocrystalline silicon, is preferably perpendicular to the wafer face, and this face oriented 7° from perpendicular to the impinging ion beam. In other words, the wafer is tilted so that crystallographic direction is tilted 7° from parallel to the impinging ion beam. The ion implantation is otherwise done in the normal and accepted manner, with the entire surface of the wafer being uniformly exposed to the ion beam.

The photoresist layer 34 is then removed, for example, by plasma stripping. Then the wafer is annealed at 650° C. for about 15 minutes in nitrogen to remove lattice damage and to form a platinum silicide alloy. As mentioned earlier in this application, it is known that alloying platinum with silicon is desirable in a Schottky barrier. Here, annealing and alloying is simultaneous.

The thin silicon dioxide layer 20b is then etched away as for example with a buffered hydrofluoric acid etchant. With thin layer 20b removed, the entire portion of surface 18 within window 22 is exposed, including all but the outer periphery of guard ring region 32. Layer 20b can be removed by photoetching, or by simply immersing the wafer in an etchant without masking at all. The outer portion of layer 20 is many times thicker than the thin portion 20b. Even if not masked it will not be significantly reduced in thickness when etching away layer 20b.

As previously mentioned, the ions in the beam used for implant region 26 should have a velocity which permits only about 50 – 60% of the ions to penetrate a given thickness of covering layer 20b. The ion energy needed to obtain this limited range in penetration will vary with the atomic weight of the electronically neutral metal used and the ion stopping power of the covering layer 20b. For example, heavy metal ions require a higher potential to accelerate them to a given velocity than lighter metal ions. Conversely, at any given ion energy heavier ions will penetrate less deeply than lighter ions. The ion stopping power of a given material is a direct function of its atomic radius and atomic density. In this invention the voltage used to accelerate the electronically neutral metal ions forming region 26 is preselected, depending on the atomic weight of the electronically neutral metal, the thickness of the covering layer 20b, and the ion stopping power of layer 20b. It should also be repeated in this connection that the thickness of layer 20b has a thickness commensurate with the thickness of region 26 that is desired. Layer 20b preferably has an ion stopping power at least equal to that of the semiconductor. In such instance a more abrupt truncated substantially Gaussian profile in electronically neutral metal concentration is produced in region 26, and a more abrupt metal-semiconductor junction 28 is obtained. I believe that this more abrupt change between region 26 and body portion 30 of the wafer aids in obtaining the improved Schottky barrier of this invention.

A nickel layer 16 is then deposited on the lower surface 14 of the wafer to serve as an ohmic contact to body portion 30 through low resistance layer 12. If desired, wafer layer surface 14 can be directly soldered to a conductive support, preferably with a lead based solder containing an N-type impurity. A layer of aluminum is deposited over the entire upper surface of the wafer and selectively photoetched away to form electrode 24. The wafer is then heated at 450° C. in a 96% nitrogen and 4% hydrogen (by volume) for 15 minutes to insure good contact between the aluminum and the platinum silicide of region 26. The technique for making low resistance electrical connections to regions 26 and 30 is no more critical to this invention than in any other semiconductor device. Hence, it is to be understood that other contacting techniques than hereindescribed can be used.

I claim:

1. A method of making a sub-surface Schottky barrier in a semiconductive body, which barrier has electrical rectification properties substantially unaffected by contaminants on said semiconductive body, said method comprising the steps of:

covering a preselected island-like region of a surface on a semiconductive body portion with a layer that a beam of high velocity metal ions can penetrate, said layer having an ion stopping power at least about equal to that of silicon and a thickness commensurate with the thickness of an ion implanted region to be formed beneath said layer;

masking said surface surrounding said island-like region to isolate said surrounding surface from said ion beam;

uniformly exposing said surface to a beam of high velocity ions of an electronically neutral metal, said ions having an average velocity imparted by an electrical potential preselected to cause only about 50 – 60% of said ions to penetrate said layer, whereby substantially all of said ions that penetrate said layer lodge within about 500 angstroms of said surface and form a shallow island-like region in said portion having a narrow truncated substantially Gaussian concentration profile of metal atoms that is maximum at said surface;

continuing said exposure to said ion beam until said surface is given an ion beam dose of at least about $1 \times 10^{15}$ atoms per square centimeter and said island-like region becomes functionally metallic with respect to the remainder of said body portion, whereby said island-like region forms a surface-contaminant-free sub-surface Schottky barrier with said body portion within about 500 angstroms of said surface;

making a low resistance electrical connection to said island-like region; and making a low resistance electrical connection to said body portion outside said region.

2. A method of making a sub-surface Schottky barrier in a semiconductive body, which barrier has electrical rectification properties substantially unaffected by contaminants on said semiconductive body surface, said method comprising the steps of:

masking a surface of a semiconductive body portion of one conductivity type to isolate said surface from an impurity of opposite conductivity determining type;

opening an annular window in said masked surface to expose an annular area of said surface;

introducing an opposite conductivity determining impurity into said exposed annular surface area to form an annular opposite conductivity type region in said body portion and intersecting said surface with an inner and outer periphery;

re-masking said annular surface area so that said entire surface of said portion is isolated from a beam of high velocity metal ions;

opening a circular window in said masked surface to expose a circular surface portion bounded by the inner periphery of said region, said circular window being concentric with said annular region and having a diameter slightly greater than the inner periphery of said annular region and significantly less than the outer periphery of said annular region area;

covering said circular surface portion with a layer that a beam of high velocity electronically neutral metal ions can penetrate, said layer having an ion stopping power at least about equal to that of silicon and a thickness commensurate with the thickness of an ion implanted region to be formed beneath said layer;

uniformly exposing said surface to a beam of high velocity ions of an electronically neutral metal, said ions having an average velocity imparted by an electrical potential preselected to cause only about 50 – 60% of said ions to penetrate said layer, whereby substantially all of said ions that penetrate said layer lodge within about 500 angstroms of said surface and form a shallow island-like region in said portion having a narrow truncated substantially Gaussian concentration profile of metal atoms that is maximum at said surface;

continuing said exposure to said ion beam until said surface is given an ion beam dose of at least about $1 \times 10^{15}$ atoms per square centimeter and said island-like region becomes functionally metallic with respect to the remainder of said body portion including said annular region, whereby said island-like region forms a surface-contaminant-free sub-surface Schottky barrier with said body portion within about 500 angstroms of said surface;

making a low resistance electrical connection to said island-like region; and making a low resistance electrical connection to said body portion outside both of said regions.

3. A method of making a sub-surface Schottky barrier in a silicon body, which barrier has electrical rectification properties substantially unaffected by contaminants on said semiconductive body surface, said method comprising the steps of:

masking a surface of a silicon body portion of one conductivity type to isolate said surface from an impurity of opposite conductivity determining type;

opening an annular window in said masked surface to expose an annular area of said surface;

introducing an opposite conductivity determining impurity into said exposed annular surface area to form an annular opposite conductivity type region in said body portion and intersecting said surface with an inner and outer periphery;

re-masking said annular surface area so that said entire surface of said portion is isolated from a beam of high velocity metal ions;

opening a circular window in said masked surface to expose a circular surface portion bounded by the inner periphery of said region, said circular window being concentric with said annular region and having a diameter slightly greater than the inner periphery of said annular region and significantly less than the outer periphery of said annular region area;

covering said circular surface portion with a layer that a beam of high velocity platinum ions can penetrate, said layer having an ion stopping power at least about equal to that of silicon and a thickness commensurate with the thickness of an ion implanted region to be formed beneath said layer;

uniformly exposing said surface to a beam of high velocity platinum ions, said platinum ions having an average velocity imparted by an electrical potential preselected to cause only about 50 – 60% of said platinum ions to penetrate said layer, whereby substantially all of said platinum ions that penetrate said layer lodge within about 500 angstroms of said surface and form a shallow island-like region in said portion having a narrow truncated substantially Gaussian concentration profile of platinum atoms that is maximum at said surface;

continuing said exposure to said ion beam until said surface is given an ion beam dose of at least about $1 \times 10^{15}$ atoms per square centimeter and said island-like region becomes functionally metallic with respect to the remainder of said body portion including said annular region, whereby said island-like region forms a surface-contaminant-free sub-surface Schottky barrier with said body portion within about 500 angstroms of said surface;

heating said silicon body to concurrently anneal it after ion implantation and alloy said platinum with said silicon;

making a low resistance electrical connection to said island-like region; and making a low resistance electrical connection to said body portion outside both of said regions.

* * * * *